United States Patent
Nara

(10) Patent No.: US 8,762,096 B2
(45) Date of Patent: Jun. 24, 2014

(54) TRIGGER GENERATION FOR DIGITAL MODULATION SIGNAL ANALYSIS

(75) Inventor: Akira Nara, Tokyo (JP)

(73) Assignee: Tektronix International Sales GmbH, Rheinfall (CH)

( * ) Notice: Subject to any disclaimer, the term of this patent is extended or adjusted under 35 U.S.C. 154(b) by 0 days.

(21) Appl. No.: 12/972,264

(22) Filed: Dec. 17, 2010

(65) Prior Publication Data

US 2012/0179415 A1    Jul. 12, 2012

(30) Foreign Application Priority Data

Dec. 18, 2009 (JP) .................................. 2009-287567

(51) Int. Cl.
- *G01D 3/00* (2006.01)
- *H04L 27/38* (2006.01)
- *G01R 13/02* (2006.01)
- *G01R 23/16* (2006.01)

(52) U.S. Cl.
CPC ........ *H04L 27/3845* (2013.01); *G01R 13/0254* (2013.01); *G01R 23/16* (2013.01)
USPC .............................. 702/125; 702/57; 702/124

(58) Field of Classification Search
CPC . G01R 13/0254; G01R 23/16; H04L 27/3845
USPC ................................................ 702/57, 79, 125
See application file for complete search history.

(56) References Cited

U.S. PATENT DOCUMENTS

| 5,550,867 A | 8/1996 | Yamamoto et al. |
| 2009/0082982 A1 | 3/2009 | Cain |

FOREIGN PATENT DOCUMENTS

EP    2048509 A1    4/2009

*Primary Examiner* — Mischita Henson
(74) *Attorney, Agent, or Firm* — Marger Johnson & McCollom PC

(57) ABSTRACT

A modulation error is detected every symbol data to generate a trigger signal. The present invention focuses that there are limited patterns of shifts from one symbol data to the next one of the digital modulation signal. Measured values of amplitude, phase and/or frequency of symbol data are latched and then values at the next symbol timing are predicted from the latched measured values using said feature. The predicted and measured values are compared at the following symbol timing. If the difference (error) is over an acceptable range, a trigger signal is provided which allows acquiring a modulation error by symbol data.

16 Claims, 8 Drawing Sheets

TRIGGER GENERATION FOR DIGITAL MODULATION SIGNAL ANALYSIS

FIELD OF THE INVENTION

The present invention relates to analysis of a digital modulated signal for a signal analyzer, especially, to trigger generation for the analysis of digital modulated signal.

BACKGROUND OF THE INVENTION

Various wireless systems including a mobile phone, wireless LAN, etc. use a wireless signal modulated by digital modulation format such as QPSK, etc. The RSA3408B Real-Time Spectrum analyzer manufactured by Tektronix, Inc., Beaverton, Oreg., U.S.A. is a signal analyzer suitable for analyzing such a modulated wireless signal.

FIG. 1 is a functional block diagram of an exemplary signal analyzer 10. An attenuator (ATT) 12 receives a signal under test to adjust the level appropriately. An analog down converter 20 has a mixer 14, a local oscillator (LO) 16 and a band pass filter (BPF) 18 to down-convert the input signal. An analog to digital converter 22 converts the down-converted signal to digital data according to a sampling clock from a clock generator 24. Note that a frequency of the sampling clock is well higher than the symbol rate of the received signal. A digital down converter (DDC) 26 further down-converts the digital data by digital calculation and separate them into I (Inphase) and Q (Quadrature) data. A trigger detector 30 receives the I and Q data (symbol data) of time domain data to detect I and Q data satisfying a trigger condition that a user presets concerning the time domain for providing a trigger signal to a memory controller 34. A fast Fourier transform (FFT) circuit 32 converts the I and Q data to frequency domain data to provide them to the trigger detector 30. The trigger detector 30 detects frequency domain data satisfying a trigger condition that the user preset concerning the frequency domain for providing a trigger signal to the memory controller 34. The memory controller 34 controls a data memory 28 to retain pre and post I and Q data around the trigger event of which time duration is set by the user when it receives the trigger signal. These blocks may be realized with hardware such as FPGA, ASIC, etc. to achieve real-time fast processes.

The IQ data of satisfying time and/or frequency domain trigger conditions in the data memory 28 is transferred to a microprocessor system with a CPU (Central Processing Unite) 36 through a bus 52. The microprocessor system may be known as a personal computer (PC) and the CPU 36 controls the signal analyzer 10 according to programs (software) stored in a hard disk drive (HDD) 42. The HDD 42 may be used to store a large amount of data that may not be always used. A memory 40, such as RAM, is used for a work area for the CPU 36 to read programs from the HDD 42.

A user can set up the signal analyzer 10 via an operation panel 44 that includes keys, knobs, and the like. Modulation formats, symbol rates, etc. used in mobile phone, wireless LAN are defined as standards so that the user sets up the settings depending on the signal under test. This allows starting the signal analysis smoother relative to "no-settings". The parameters such as symbol rate may be replaced after when more accurate values are determined through the signal analysis.

A display device 38 provides visual information relating to the signal analysis and the user settings. An input/output port 46 is used for connecting an external keyboard 48, a pointing device 50, such as a mouse, and the like to the signal analyzer. They may be included as parts of the user interface of the signal analyzer 10. These blocks are coupled together via the bus 52.

The CPU 36 conducts the signal analysis concerning the IQ data from the data memory 28 according to the programs stored in the HDD 42. FIG. 2 is a functional block diagram of analyzing a digital modulation signal with software processes by the CPU 36, especially, it has recursive processes that detect the IQ data (symbol data) and generate an ideal signal to compare it with a measured signal for determining a modulation error. A carrier frequency correction block 62 corrects a frequency error of the IQ data due to the carrier frequency error by the digital down conversion at the DDC 26 by calculation. A measurement filter block 67 is a replica of characteristics of filters used in a receiver side and reduces noise components and intersymbol interference. A code demodulator 65 demodulates the IQ data into baseband data wherein the baseband data is generated as ideal one. This process uses that the IQ data are digital data and then it is relatively easy to assume the ideal values of the phases and amplitudes of the IQ data if the signal under test does not have significant distortions. A digital modulation block 66 modulates the ideal baseband data to generate IQ data of an ideal digital modulation signal. A reference filter block 67 is a filter of integrating filters of transmitter and receiver sides and eliminates a leak to an adjacent channel and intersymbol interference. An error detection block 64 compares the measured IQ data from a measurement filter 63 with the ideal IQ data from the reference filter bock 67 to detect an error at each IQ data. The error detection block 64 also generates a carrier frequency error signal and extracts a symbol timing signal.

The CPU 36 also conducts fast Fourier transform (FFT) to produce spectrum data from the IQ data to display it as a spectrum waveform on the display device 38. Though the FFT circuit 32 also conducts FFT, it is for real time detection of a frequency domain trigger by implementing the FFT circuit 32 as hardware. The FFT calculation by the CPU 36 takes a longer time and does not realize real time process but provides a high precision FFT result. Therefore, the spectrum data is produced by software process of the CPU 36 after the acquisition of the IQ data satisfying a trigger condition in the data memory 28.

The signal analysis by software process of the CPU 36 using the IQ data stored in the data memory 28 provides higher modulation accuracy and symbol table, etc. However, the information can not be used for generating a trigger since the process is after the acquisition. For example, if the modulation accuracy falls suddenly it would be desired to trigger at that time to investigate the cause. However, a current system does not allow such a trigger. The software process shown in FIG. 2 is complicated recursive one so that it is difficult to realize it using ASIC or FPGA in real time and at low cost.

US patent application publication 2009/0094495 by Torin discloses a trigger generator that detects a trigger using correlation between a reference modulation signal and amplitude and/or phase waveform of a modulation signal under test. The modulation error, however, can happen in various situations so that it is difficult to specify the amplitude and/or phase waveform in a target situation. Then, it is also difficult to trigger by detecting deterioration of modulation accuracy. As described, conventional technologies are not effective to trigger by detecting deterioration of modulation accuracy of a digital modulation signal under test.

SUMMARY OF THE INVENTION

The present invention relates to a trigger generation for a signal analysis that analyzes a digital modulation signal. The digital modulation may have various amplitudes or phases but the shift patterns from one symbol data to the next one are limited on which the present invention focuses. Values of the symbol data of a signal under test are measured and acquired with well known art and stored in a memory. Based on the modulation format and the symbol rate of the signal under test, available shifts between the symbol data are evaluated. The modulation format and the symbol rate are typically set by a user at first depending on the signal under test. However, the initial settings may be modified after the signal analysis based on the initial settings by using the analysis resultants. A first symbol timing signal is generated based on the symbol rate of the signal under test. Based on the measured values of the symbol data of the signal under test and the available shifts between the symbol data, predicted values of the symbol data is generated. The measured and predicted values are compared to generate a trigger if the result is over an acceptable range that may be preset by the user.

Additionally, the present invention could keep accuracy of the symbol timing used for detecting the trigger for stable trigger detection. At first, second symbol timing signals are extracted from the measured values of symbol data of the signal under test. This process is typically software calculation so that the extracted second symbol timing signals indicate past symbol timing relative to when the calculation finishes. However, the extracted second symbol timing signals are expected to occur at a constant interval and the present invention may extrapolate the second symbol timing signals subsequent to the extracted second symbol timing signals. Then, a synch signal is generated with synchronizing it with the second symbol timing signals including the extracted and extrapolated second symbol timing signals. This allows the first symbol timing signals keeping synchronized with the actual symbol timing of the signal under test.

The objects, advantages and novel features of the present invention are apparent from the following detailed description when read in conjunction with appended claims and attached drawings.

DETAILED DESCRIPTION OF THE EMBODIMENTS

Now embodiments according to the present invention are described blow and the examples of the embodiments are drawn for explanation. However, the scope of the present invention is not limited to the embodiments.

Figure 1:
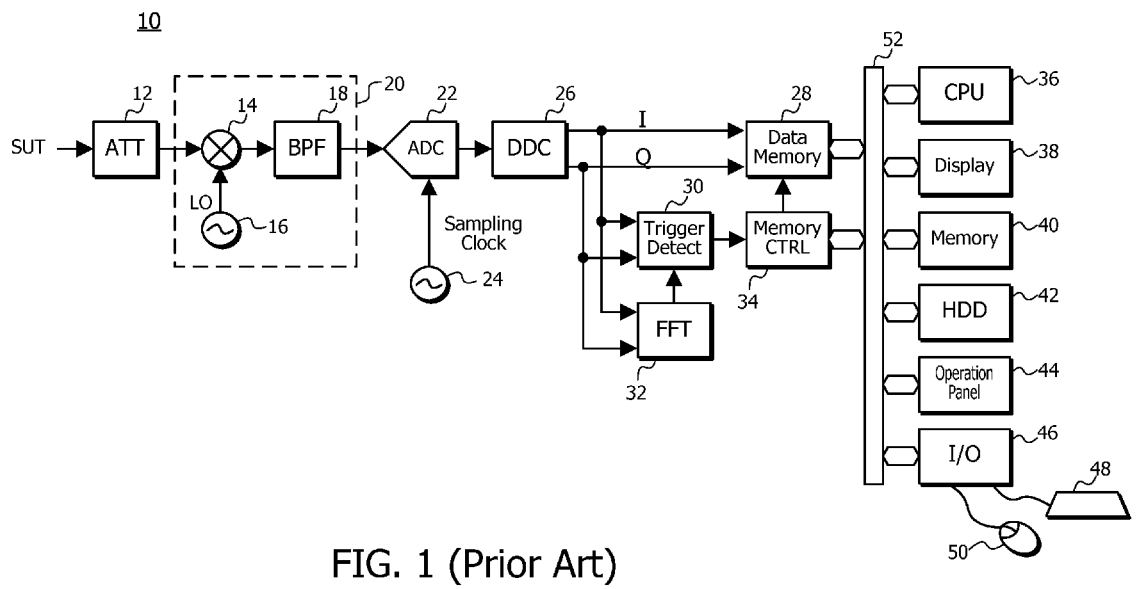
FIG. 1 is a schematic block diagram of a conventional signal analyzer.
Figure 3:
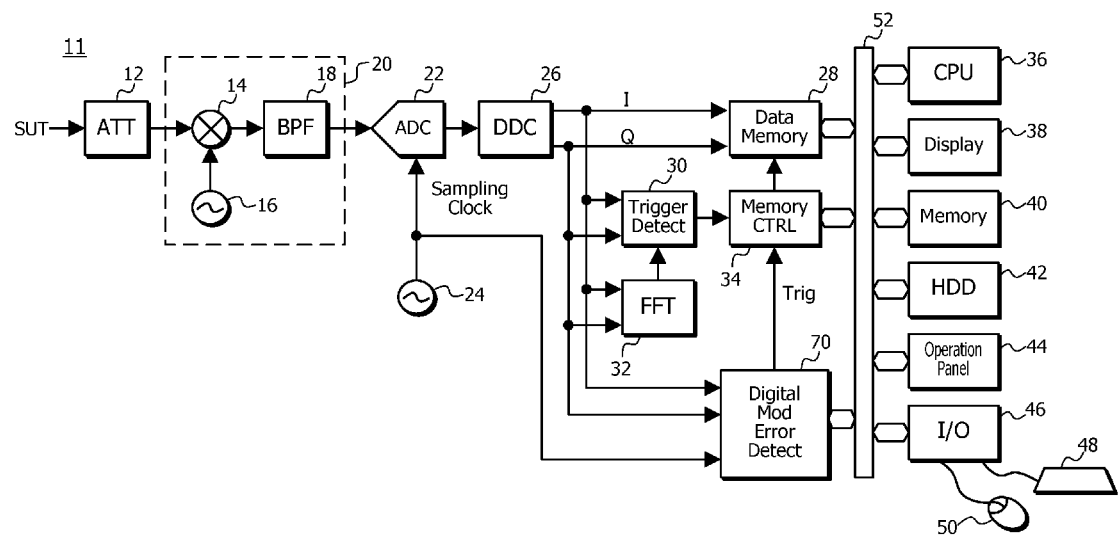
FIG. 3 is a schematic block diagram of a signal analyzer suitable for implementing the presenting invention.

Referring to FIG. 3, a signal analyzer 11 suitable for applying the present invention additionally has a digital modulation error detection circuit 70 relative to a conventional one shown in FIG. 1. It may be realized as hardware with FPGA, ASIC, etc. that operates faster than a software process by CPU 36. In FIG. 3, blocks corresponding to those in FIG. 1 have the same reference numbers and features different from FIG. 1 are especially described blow. Similar to the above, it is assumed that a user sets initial values of modulation format, symbol rate, etc. to the signal analyzer 11. Besides, the user may set an acceptable range of a difference (error) between predicted measured values of symbol data described below. The error acceptable range is a trigger condition for the present invention. The user also sets the number N (N is a natural number) of symbol timings to generate a symbol synch signal (described below) every N of the symbol timings.

Figure 2:
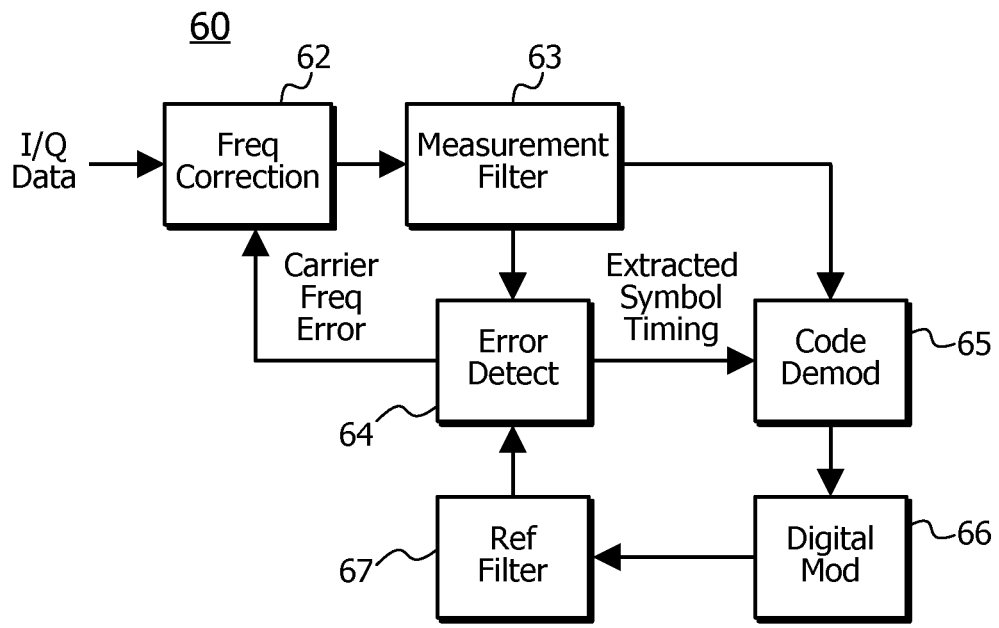
FIG. 2 is a block diagram of a software process example for a conventional signal analyzer.
Figure 4:
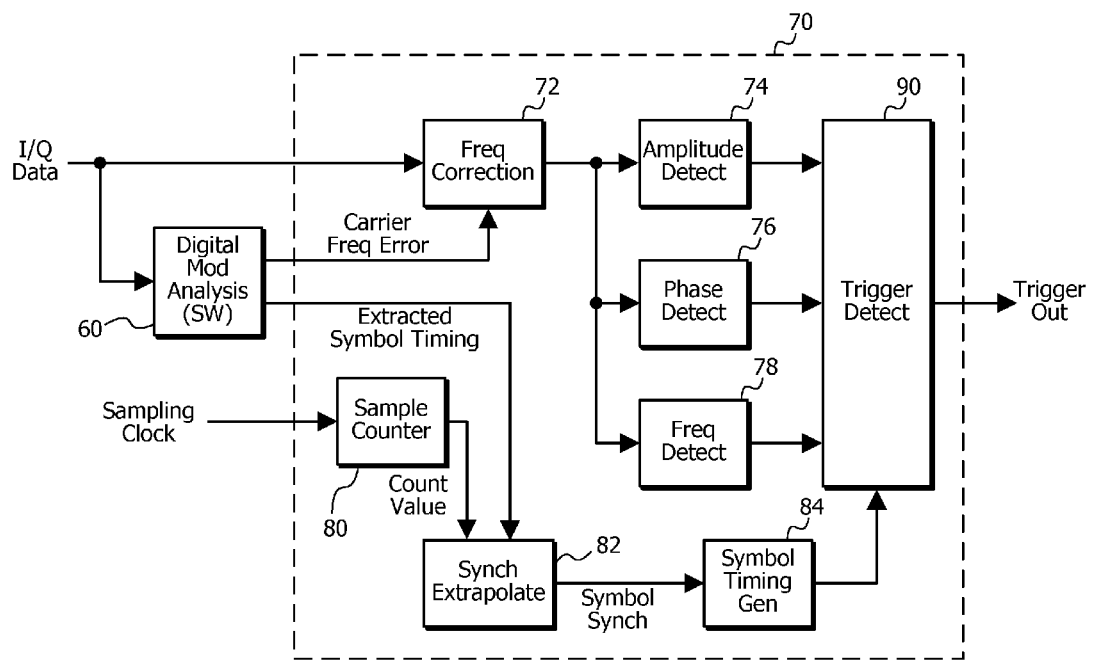
FIG. 4 is a digital modulation analysis block and a block diagram of a digital modulation error detection circuit according to the present invention.

The digital modulation error detection circuit 70 receives I and Q data from a DDC 26 and a sampling clock from a clock generator 24. FIG. 4 is a block diagram of the digital modulation error detection circuit 70. A digital modulation signal analysis block 60 is similar to the conventional one shown in FIG. 2 but has different features in that it provides a carrier frequency error signal and an extracted symbol timing signal to the digital modulation error detection circuit 70.

A carrier frequency correction block 72 corrects frequency errors of the IQ data due to an error of the carrier frequency used in the digital down conversion. Then the corrected IQ data are provided to an amplitude detection block 74, a phase detection block 76 and a frequency detection block 78 to detect measured values of amplitude, phase and frequency that are provided to a trigger detection block 90. Each of the blocks is used depending on what type of a modulation accuracy error the user wants to detect. For example, the amplitude detection block 74 is used to detect an amplitude error and the phase detection block 76 is used to detect a phase error. Both the amplitude detection block 74 and phase detection block 76 are used for detecting an EVM (Error Vector Magnitude). The frequency detection block 78 is used to detect a frequency error. These detections are realized by IQ data calculations according to the equations below wherein X and Y are I and Q components respectively.

Amplitude: $A = \text{SQRT}(X^2 + Y^2)$

Phase: $P = \text{TAN}^{-1}(Y/X)$

Frequency: $F = d/dt\ \text{TAN}^{-1}(Y/X)$

A sample counter 80 receives a sampling clock and provides the counted values to a synch signal extrapolation block 82. The synch signal extrapolation block 82 generates a symbol synch signal as described below and provides it to a symbol timing signal generation block 84. The symbol timing signal generation block 84 generates a symbol timing signal according to the initial settings at first. However, when it receives a symbol synch signal, it synchronizes the phase of the symbol timing signal with that of the symbol synch signal, which prevents the symbol timing signal from having a time difference from an actual symbol timing of the signal under test. The symbol timing signal determines timing of error detection at the trigger detection block 90 so that it is called an error detection symbol timing signal hereinafter.

The digital modulation signal may have various amplitudes and phases but the variation patterns from one symbol to the next symbol are limited. For example, phase shifts of QPSK are four patterns of 0, +90, −90 and 180 degrees from the current phase. Then, the present invention focuses on the variations or shifts to evaluate the modulation error. The following table 1 shows shifts of amplitude, phase and frequency between symbols for representative modulations.

TABLE 1

| Modulation | Amplitude Shift (ratio) | Phase Shift (degree) | Freq Shift (Hz) |
|---|---|---|---|
| QPSK | 1 | 0, +/−90, 180 | n/a |
| p/4 shift DQPSK | 1 | 0, +/−90, +/−270 | n/a |
| MSK | 1 | +/−180 | n/a |
| FSK | 1 | n/a | 0, +/−2Fd* |

*Frequency Deviation

Figure 5:
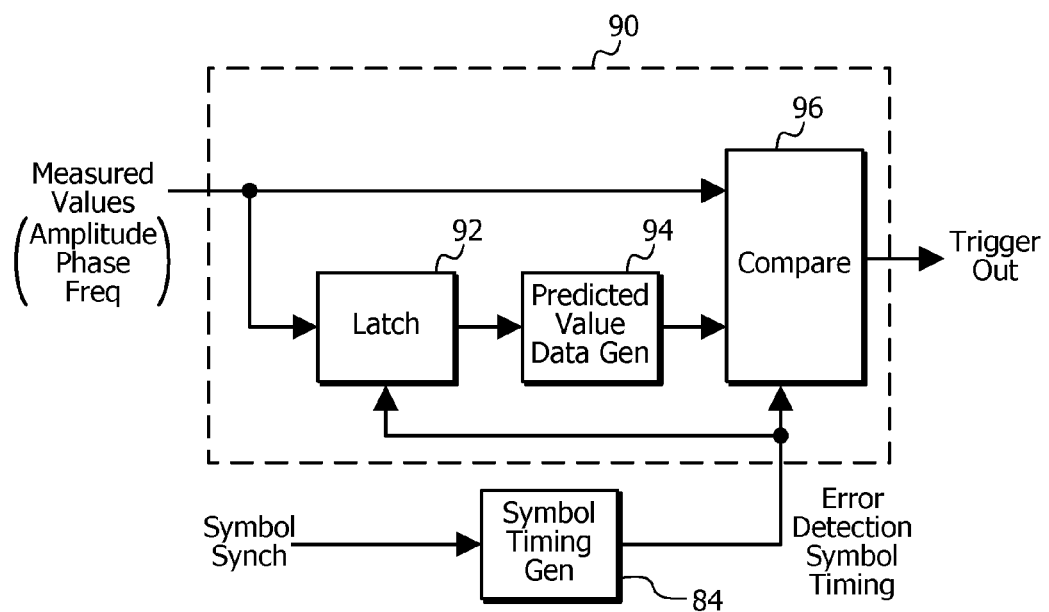
FIG. 5 is a block diagram of a trigger detection block.

FIG. 5 is a block diagram of the trigger detection block 90. A latch block 92 latches measured values of amplitude, phase and/or frequency according to the error detection symbol timing signal to hold them as latched measured values. The modulation format is set previously so that a predicted value generation block 94 derives predicted values available at the next symbol timing from the latched measured values and provides them to a comparison block 96. The predicted value may be one or more as shown in the table 1. The comparison block 96 compares the measured value with the corresponding predicted values according to the error detection symbol timing signal and provides a trigger signal if the difference (error) is over the error acceptable range that the user designates previously. This process repeats every symbol so that an error at each symbol point is monitored in real time. Therefore, a trigger is generated without missing any of error information.

Figure 6:
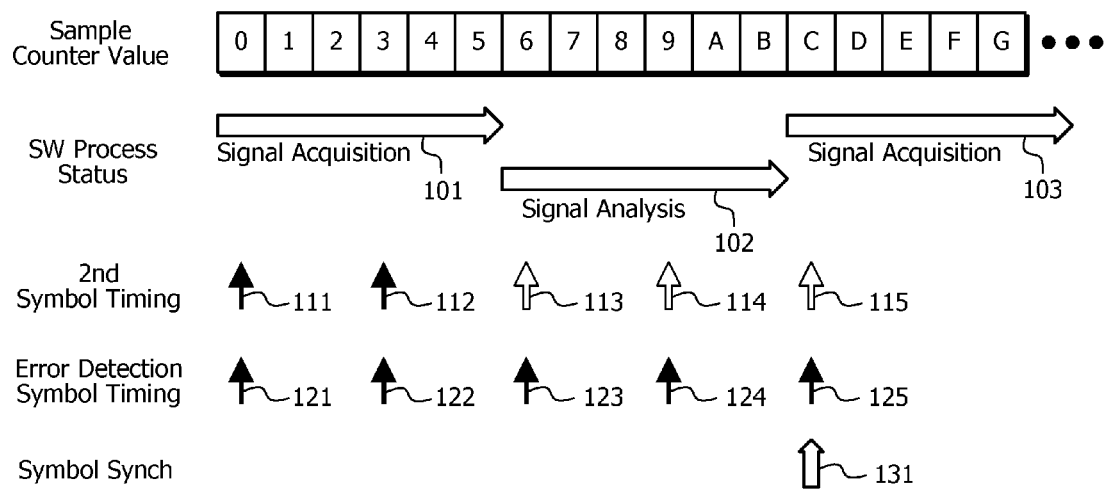
FIG. 6 is a chart of indicating relationship between extracted symbol timing, error detection symbol timing and a symbol synch signal.

It is important to keep accuracy of the error detection symbol timing signal used for trigger detection that does not deviate from the symbol timing of the digital modulation signal under test. It is described below. Referring to FIG. 6, the present invention maps the extracted symbol timing signals extracted through the signal analysis process to the count values of the sample counter 80 counting the sampling clock that is well faster than the symbol timing. The signal analyzer 11 repeats the signal acquisition process and the signal analysis process alternatively. Because of the times of these processes, in an example of FIG. 6, it is not revealed that past extracted symbol timing signals 111 and 112 were occurred at the count values "0" and "3" respectively until the signal analysis process 102 completes at the count value "B". However, symbol timing signals 113-115 that are expected to occur after the extracted symbol timing signals 111 and 112 can be extrapolated based on the symbol timing signals 111 and 112 because they are expected to occur at a constant interval. The synch signal extrapolation block 82 combines the actually extracted symbol timing signals and the extrapolated symbol timing signals as second symbol timing signals, and generates a symbol synch signal 131 once every preset number of the second symbol timing signals. Then, as described above, the symbol timing signal generation block 84 synchronizes the error detection (first) symbol timing signal with the symbol synch signal.

Figure 7:
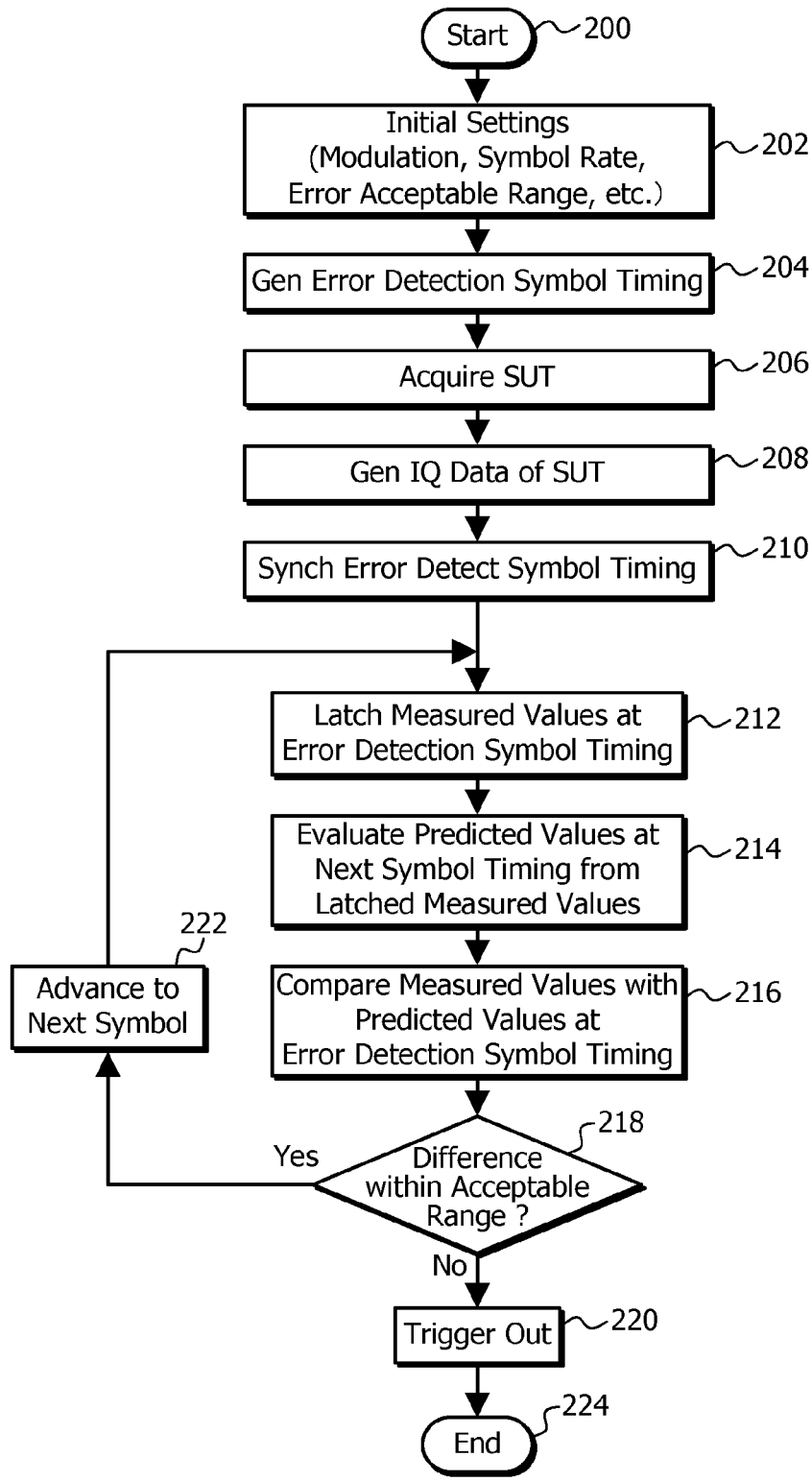
FIG. 7 is a flowchart of an embodiment of a trigger detection process according to the present invention.

FIG. 7 is an example of a process flow according to the present invention. In step 202, a user typically provides initial settings including modulation format, symbol rate, error acceptable range, the number of symbol timings required for generating a symbol synch signal, etc. These initial settings may be modified if more suitable values are found in the subsequent process. According to the initial settings, the error detection symbol timing signal is generated (step 204). After steps of SUT (signal under test) acquisition (step 206) and IQ data generation (step 208), a process of synchronizing the error detection symbol timing signal with the symbol synch signal is conducted (step 210). Alternatively, the process from the step 206 through the step 210 may be repeated as to surely synchronize the error detection symbol timing signal with the symbol synch signal. In step 212, measured values of the amplitudes, phases and frequencies of the symbol data (IQ data) are latched according to the error detection symbol timing signal. Predicted values at the next symbol timing are evaluated from the latched measured values using the available shifts (step 214). The measured values and the predicted values are compared (step 216) to determine whether the differences (errors) between them are within the acceptable range (step 218). If the errors are within the acceptable range (Yes at step 218), the process from the step 212 is repeated. If the errors are out of the acceptable range (No at step 218), a trigger signal is provided (step 220) and one cycle of the trigger detection process finishes. An example of the process following the trigger signal output is described as a conventional art.

Figure 8:
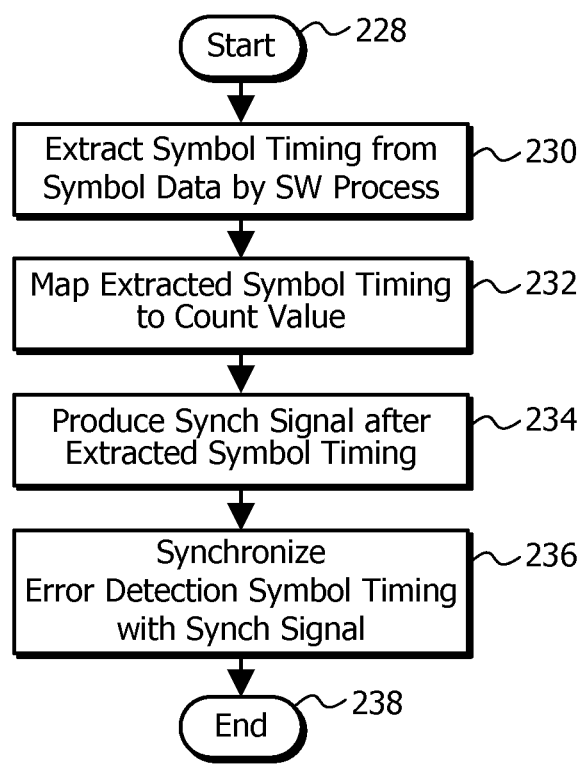
FIG. 8 is a flowchart of an embodiment of process for synchronizing an error detection symbol timing signal according to the present invention.

FIG. 8 is an example of a synch process flow of the error detection symbol timing signal. It may be conducted as the step 210 of FIG. 7 for example. Alternatively, it may be conducted in parallel to the steps of the step 212 and later ones. After the steps 206 and 208 of FIG. 7, the symbol timing signals are extracted from the IQ data by software signal analysis. The extracted symbol timing signals are mapped to the count values from the sample counter 80 (step 232). Based on the extracted symbol timing signals, symbol timing signals following the extracted symbol timing signals are extrapolated and then a symbol synch signal synchronized with the extrapolated symbol timing signals is generated every preset number of the second symbol timing signals that include the extracted and extrapolated symbol timing signals (step 234). The symbol timing signal generation block 84 receives the symbol synch signal to synchronize the output error detection symbol timing signal with the symbol synch signal (step 236).

As described, the present invention focuses on shifts between symbol data and the next symbol data so that it is not necessary to conduct the whole of the demodulate in real time. This allows making the real time process unit compact and flexible as it can accept additional modulation format or adapt to modulation format modification easily. Then, the present invention realizes digital modulation error trigger that adapts to various digital modulation formats and symbol rates. The frequency error and symbol timing are observed and the resultant data are updated successively that allows waiting a trigger for a long time. It would be understood by comparing FIGS. 1 and 3 that the trigger system according to the present invention could be easily combined with the conventional trigger system such as power trigger, frequency mask trigger, etc.

Although particular embodiments have been described, it will be appreciated that the principles of the invention are not limited to those embodiments. Variations and modifications may be made without departing from the principles of the invention as set forth in the following claims.

What is claimed is:

1. A signal analyzer for analyzing a digital modulation signal under test having a digital modulation error detection circuit comprising:
   a plurality of non-transitory detection blocks configured to provide measured values of symbol data of the digital modulation signal under test;
   a non-transitory trigger detection block configured to evaluate available shifts between symbol data of the digital modulation signal under test according to the modulation format and the symbol rate of the digital modulation signal under test;

a non-transitory symbol timing signal generation block configured to generate first symbol timing signals according to the symbol rate of the digital modulation signal under test;

a non-transitory predicted value generation block configured to generate predicted values of the symbol data using the measured values and the available shifts; and a non-transitory comparison block configured to compare the predicted values and corresponding measured values according to the first symbol timing signals to determine whether the comparison result is within or out of an acceptable range, wherein the comparison block is further configured to provide a trigger signal if the comparison result is out of the acceptable range.

2. The signal analyzer as recited in claim 1 further comprising:

a non-transitory digital modulation signal analysis block configured to generate second symbol timing signals extracted from the measured values of the symbol data of the digital modulation signal under test;

a non-transitory synch signal extrapolation block configured to generate a synch signal synchronized with the second symbol timing signals that includes the extracted second symbol timing signals and extrapolated second symbol timing signals subsequent to the extracted second symbol timing signals; and a non-transitory symbol timing signal generation block configured to synchronize the first symbol timing signal with the synch signal.

3. The signal analyzer as recited in claim 2 further comprising a counter for counting a clock of which frequency is higher than that of the first symbol timing signal to provide count values;

wherein the synch signal extrapolation block is further configured to map the extracted second symbol timing signals to the count values respectively;

wherein the digital modulation signal analysis block is further configured to extract the second symbol timing signals subsequent to the second symbol timing signals; and wherein the synch signal extrapolation block is further configured to generate the synch signal once every preset number of the second symbol timing signals including the extracted and extrapolated second symbol timing signals.

4. The signal analyzer as recited in claim 1 further comprising:

means for setting the acceptable range.

5. The signal analyzer as recited in claim 1 further comprising:

means for setting the modulation format and the symbol rate of the digital modulation signal under test.

6. The signal analyzer as recited in claim 2 further comprising:

means for setting the number of the second symbol timing signals to generate the synch signal.

7. The signal analyzer as recited in claim 1 further comprising a latch block of the digital modulation error detection circuit configured to latch the measured values at one of the first symbol timing signals wherein the predicted value generating means generates the predicted value for the first symbol timing signal after the latch using the latched measured values.

8. A method for generating a trigger for analyzing a digital modulation signal under test comprising steps of:

a plurality of non-transitory detection blocks of a digital modulation error detection circuit of a signal analyzer providing measured values of symbol data of the digital modulation signal under test;

a non-transitory trigger detection block of the digital modulation error detection circuit evaluating available shifts between symbol data of the digital modulation signal under test according to the modulation and the symbol rate of the digital modulation signal under test;

a non-transitory symbol timing signal generation block of the digital modulation error detection circuit generating a first symbol timing signal according to the symbol rate of the digital modulation signal under test;

a non-transitory predicted value generation block of the digital modulation error detection circuit generating predicted values of the symbol data using the measured values and the available shifts; and a non-transitory comparison block of the digital modulation error detection circuit comparing the predicted values and corresponding measured values according to the first symbol timing signals to determine whether the comparison result is within or out of an acceptable range, the comparison block further providing a trigger signal if the comparison result is out of the acceptable range.

9. The method for generating the trigger as recited in claim 8 further comprising steps of:

a non-transitory digital modulation signal analysis block generating second symbol timing signals extracted from the measured values of the symbol data of the digital modulation signal under test;

a non-transitory synch signal extrapolation block of the digital modulation error detection circuit generating a synch signal synchronized with the second symbol timing signals that includes the extracted second symbol timing signals and extrapolated second symbol timing signals subsequent to the extracted second symbol timing signals; and a non-transitory symbol timing signal generation block of the digital modulation error detection circuit synchronizing the first symbol timing signal with the synch signal.

10. The method for generating the trigger as recited in claim 9 wherein the step of generating the synch signal comprising steps of:

a counter of the digital modulation error detection circuit providing count values by counting a clock of which frequency is higher than that of the first symbol timing signal;

the synch signal extrapolation block mapping the extracted second symbol timing signals to the count values respectively;

the digital modulation signal analysis block extrapolating the second symbol timing signals subsequent to the extracted second symbol timing signals; and the synch signal extrapolation block generating the synch signal once every preset number of the second symbol timing signals including the extracted and extrapolated second symbol timing signals.

11. The method for generating the trigger as recited in claim 8 further comprising a step of setting the acceptable range.

12. The method for generating the trigger as recited in claim 8 further comprising a step of setting the modulation format and the symbol rate of the digital modulation signal under test.

13. The method for generating the trigger as recited in claim 8 further comprising a step of setting the number of the second symbol timing signals to generate the synch signal.

14. The method for generating the trigger as recited in claim 8 further comprising a latch block of the digital modulation error detection circuit latching the measured values at one of the first symbol timing signals wherein the predicted value generation block generates the predicted value for the first symbol timing signal after the latch using the latched measured values.

15. The trigger generator as recited in claim 1 in which the plurality of detection blocks comprises a non-transitory amplitude detection block configured to provide a measured value of amplitude, a non-transitory phase detection block configured to provide a measured value of phase, and a non-transitory frequency detection block configured to provide a measured value of frequency.

16. The method for generating the trigger as recited in claim 8 in which the plurality of detection blocks comprises a non-transitory amplitude detection block providing a measured value of amplitude, a non-transitory phase detection block providing a measured value of phase, and a non-transitory frequency detection block providing a measured value of frequency.

* * * * *